(12) United States Patent
Tao

(10) Patent No.: US 10,263,125 B2
(45) Date of Patent: Apr. 16, 2019

(54) VARACTOR DIODE WITH HETEROSTRUCTURE

(71) Applicant: TriQuint Semiconductor, Inc., Hillsboro, OR (US)

(72) Inventor: Nick Gengming Tao, Portland, OR (US)

(73) Assignee: Qorvo US, Inc., Greensboro, NC (US)

( * ) Notice: Subject to any disclaimer, the term of this patent is extended or adjusted under 35 U.S.C. 154(b) by 488 days.

(21) Appl. No.: 14/280,404

(22) Filed: May 16, 2014

(65) Prior Publication Data
US 2015/0333192 A1    Nov. 19, 2015

(51) Int. Cl.
  H01L 29/93    (2006.01)
  H01L 29/66    (2006.01)
  H01L 29/205   (2006.01)

(52) U.S. Cl.
  CPC ........... *H01L 29/93* (2013.01); *H01L 29/205* (2013.01); *H01L 29/66174* (2013.01)

(58) Field of Classification Search
  CPC .......................... H01L 29/2003; H01L 29/93
  USPC .......................................... 257/201; 438/379
  See application file for complete search history.

(56) References Cited

U.S. PATENT DOCUMENTS

| | | | |
|---|---|---|---|
| 9,099,518 B1 * | 8/2015 | Henderson | H01L 29/732 |
| 2005/0145884 A1 * | 7/2005 | Nogome | H01L 29/7371 |
| | | | 257/197 |
| 2010/0308211 A1 * | 12/2010 | Cho | H01L 27/14625 |
| | | | 250/214 R |
| 2014/0110761 A1 * | 4/2014 | Yang et al. | 257/197 |
| 2014/0332928 A1 * | 11/2014 | Marino et al. | 257/602 |

OTHER PUBLICATIONS

Welty, Rebecca J., et al.; "Design and Performance of Tunnel Collector HBTs for Microwave Power Amplifiers;" IEEE Transactions on Electron Devices, vol. 50, No. 4, Apr. 2003.
Yang, Yuefei, et al.; "An InGaP/GaAs DHBT with an Integrated Wide-Tuning-Range Varactor for Broad Band Monolithic VCO Applications;" Abstract; International Conference on Compound Semiconductor Manufacturing Technology, May 2014.
Preliminary Search Report and Written Opinion for French Patent Application No. 15054009, dated Aug. 10, 2017, 10 pages.
Examination Report and Search Report for Taiwanese Patent Application No. 104112553, dated Jun. 29, 2018, 10 pages.

* cited by examiner

*Primary Examiner* — Fernando L Toledo
*Assistant Examiner* — Neil R Prasad
(74) *Attorney, Agent, or Firm* — Withrow & Terranova, P.L.L.C.

(57) ABSTRACT

Embodiments of the present disclosure describe apparatuses, methods, and systems of an integrated circuit (IC) device, such as a varactor diode. The IC device includes a composite collector and heterostructure. A layer of wider band gap material is included as part of the collector at the collector/base interface. The presence of the wide band gap material may increase breakdown voltage and allow for increased hyperabrupt doping profiles in the narrower band gap portion of the collector. This may allow for increased tuning range and improved intermodulation (IMD) performance without the decreased breakdown performance associated with homojunction devices. Other embodiments may also be described and/or claimed.

20 Claims, 5 Drawing Sheets

VARACTOR DIODE WITH HETEROSTRUCTURE

FIELD

Embodiments of the present disclosure generally relate to the field of integrated circuits and varactor diodes, and more particularly, to composite collector structures for varactor diodes.

BACKGROUND

Varactor diodes generally include a pn junction with a hyperabrupt doping profile located in the n-type region such that the junction capacitance may vary with the bias. Typically, varactor diodes use the base-collector junction in a bipolar transistor where the pn junction is a homojunction of a material such as silicon (Si) or gallium arsenide (GaAs). Both the tuning range and the intermodulation distortion (IMD) performance of a varactor diode may be increased by increasing the doping levels. While increased tuning range and improved IMD performance are desirable, increasing the doping level in the traditional pn homojunction varactor negatively impacts the breakdown performance and may decrease the breakdown voltage of the device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
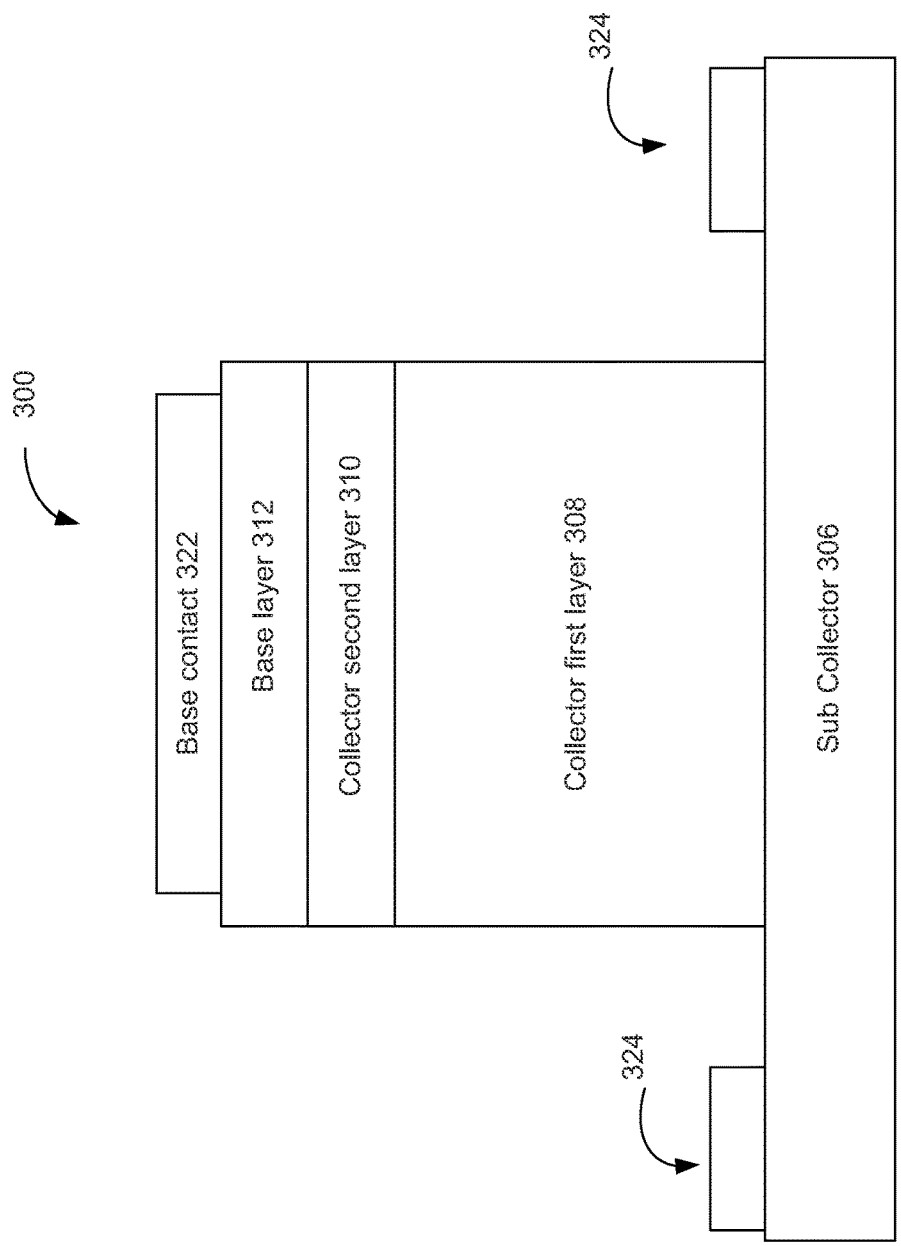
FIG. 1 schematically illustrates a varactor diode including a pn heterojunction according to some embodiments.

Embodiments of the present disclosure provide varactor diodes with heterostructures, methods of fabrication, and systems.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer," may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

Traditional varactor diodes may include p-n homojunctions that present certain challenges. In order to improve IMD performance and/or tuning range, it is necessary to increase doping levels of the devices. Increasing the doping levels in a p-n homojunction based device, however, may result in decreased breakdown performance. As such, devices with increased doping levels may have decreased operating ranges because the performance may degrade at elevated voltages as the operating voltage approaches the breakdown voltage. Thus, the IMD performance and tuning range, of p-n homojunction based devices may be limited because the increased doping levels required to produce desired IMD performance and tuning ranges may result in unacceptable decreases in breakdown performance of the device.

Various embodiments, discussed in detail below, allow for increased doping levels without sacrificing breakdown performance. In particular, the use of the composite collector structure and a heterojunction may provide improved tuning range and IMD performance as well as improved breakdown performance.

FIG. 1 schematically illustrates an IC device 300 including a pn heterojunction in accordance with various embodiments. The IC device 300 may be, for example, a varactor diode.

IC device 300 may include a sub collector 306 on which the heterostructure is formed. IC device 300 may include a composite collector having at least two layers. The composite collector may include a collector first layer 308 and a collector second layer 310. The collector first layer 308 may be formed from a relatively narrow band gap material. In some instances collector first layer 308 may be formed from GaAs. Collector first layer 308 may include a hyperabrupt doping profile. In general, doping refers to the addition of impurities to materials used to form various layers to modify their electrical properties. This can create an excess of electrons (n type doping) or electron holes (p type doping). The letters "n" and "p" are used to indicate moderately doped materials while "n+" and "p+" are used to indicate highly doped materials. In some embodiments, the base layer or layers may be p or p+ type while the collector layers may be n-type.

A hyperabrupt doping profile is one in which the doping level varies over the thickness of the layer such that the doping level is significantly higher at one interface than the other. The collector first layer 308 may include a hyperabrupt doping profile such that the doping concentration is at a minimum near the collector first layer 308/sub collector 306 interface and is at a maximum near the collector first layer 308/collector second layer 310 interface. The presence of a hyperabrupt doping profile may allow the capacitance to vary with the bias. Increasing the hyperabrupt doping level may increase one or both of the tuning range and intermodulation (IMD) performance of the device. In traditional devices, increasing the hyperabrupt doping level may also decrease the breakdown voltage, but the inclusion of the collector second layer 310 may allow for increased doping level while maintaining or improving breakdown performance.

The collector second layer 310 may be formed from a wider band gap material; in particular the material used form the collector second layer 310 may have a wider band gap than the material used to form the collector first layer 308. In some embodiments, the collector second layer 310 may be formed from indium gallium phosphide (InGaP) or aluminum gallium arsenide (AlGaAs). In some embodiments, the collector second layer 310 may include multiple layers. For instance, it may be possible to use layers of both InGaP and AlGaAs in the collector second layer 310. The presence of the collector second layer 310 may increase the breakdown voltage without causing an unwanted change in tuning range or IMD performance. Furthermore presence of the collector second layer 310 may allow increased hyperabrupt doping profiles to be utilized in the collector first layer 308. Such increased hyperabrupt doping profiles may not have been possible with traditional homojunction devices due to the unwanted decrease in breakdown voltage. Thus, inclusion of the collector second layer 310 may facilitate increased tuning ranges and improved IMD performance while increasing breakdown voltage. In some embodiments, the collector first layer 308 may include a hyperabrupt doping profile in which the doping concentration increases by at least one order of magnitude over the thickness of the collector first layer 308.

The thickness of the collector second layer 310 may be critical to realizing the improved breakdown performance without negatively impacting the tuning range or the IMD performance. In some embodiments, the collector second layer 310 may be approximately equal to or less than the thickness of the depletion region in the collector at 0 bias. During operation, as the bias is increased, the peak electric field will reside in the collector second layer 310. The wider band gap material used to form the collector second layer 310 may have a larger avalanche breakdown threshold as compared to the narrower band gap material that forms the collector first layer 308. Thus, the inclusion of the collector second layer 310, having a thickness sufficient such that the peak electric field at higher applied bias values resides in the collector second layer 310, may increase the overall breakdown voltage of the device. In some embodiments, the collector second layer 310 may have a thickness between approximately 300 angstroms to 1500 angstroms. In some embodiments the collector second layer 310 may have a thickness between approximately 300 angstroms to 1000 angstroms. In some embodiments the collector second layer 310 may be lattice matched to the collector first layer 308.

The hyperabrupt doping profile may continue through the collector second layer 310 in some embodiments. In other embodiments, the collector second layer 310 may have a constant doping profile or some other doping profile.

The collector first layer 308 may be significantly thicker than the collector second layer 310. In some embodiments, the collector first layer 308 may be at least four times the thickness of the collector second layer 310.

The IC device 300 may further include base layer 312 formed on the collector second layer 310. In some embodiments the base layer 312 may be formed of the same material as the collector first layer 308. The base layer 312 may be doped differently from collector first and second layers 308 and 310 such that a pn junction is formed at the interface between the collector second layer 310 and the base layer 312.

The IC device 300 may further include a base contact 322 and collector contacts 324. The base contact 322 and collector contacts 324 may be formed of conductive material in order to connect the IC device 300 to other components in a system. In some instances, the base contact 322 and collector contacts 324 may be formed by metallization schemes in which one or more layers of different metals (e.g., gold, silver, titanium, copper, platinum) are deposited.

Figure 2:
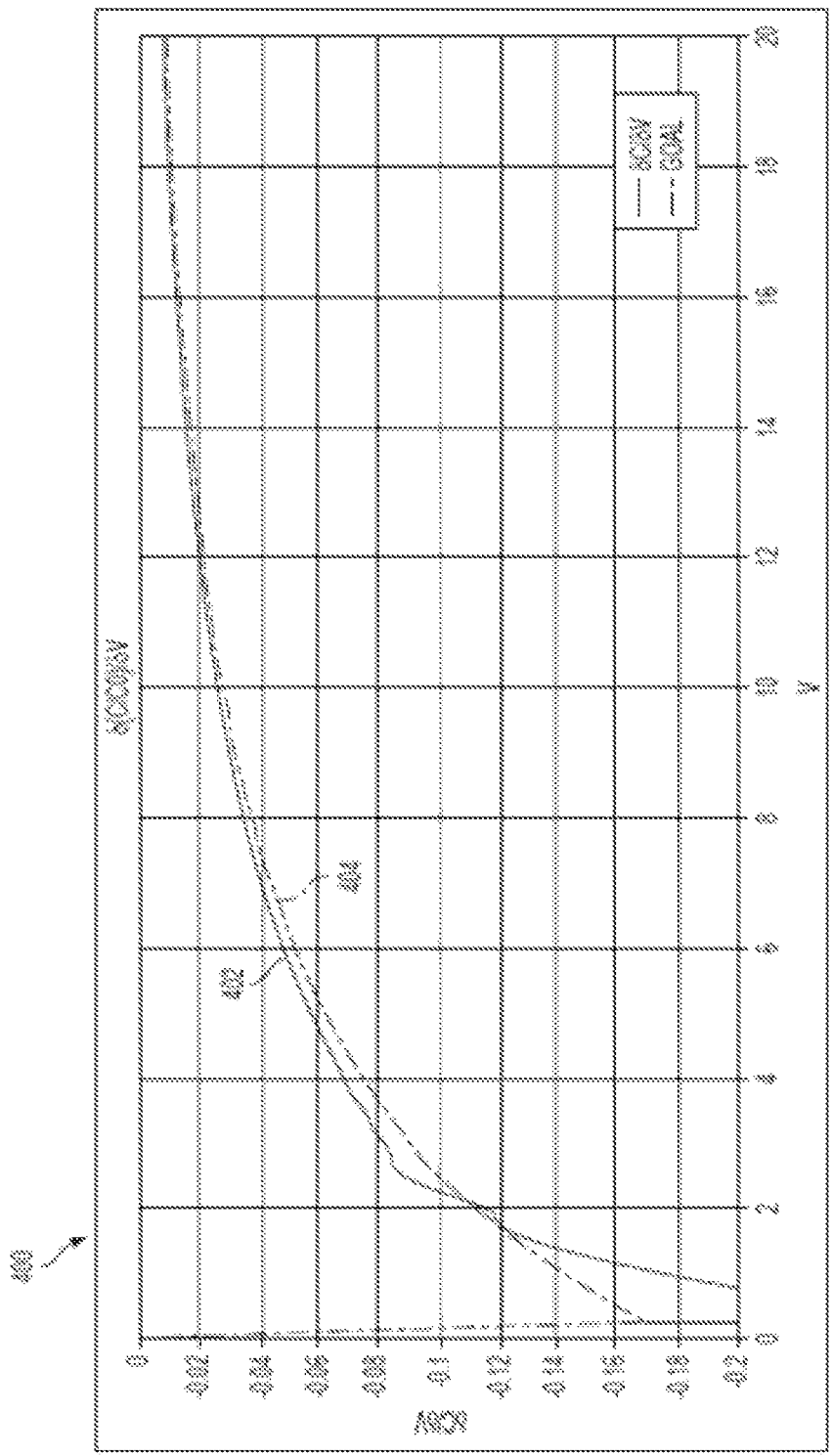
FIG. 2 is a chart illustrating the IMD performance of a varactor diode consistent with FIG. 3.

FIG. 2 is chart 400 illustrating the IMD performance of an IC device (e.g., a varactor diode) consistent with IC device 300 of FIG. 1. The chart 400 includes two lines 402 and 404. Line 404 shows an ideal IMD performance in terms of change in terms of derivative of normalized capacitance (C/C0) with respect of voltage (V), $$\frac{d(C/C0)}{dV},$$

where C0 is the capacitance at zero voltage. Line 402 shows the performance of IC device 300. IC device 300 may exhibit improved IMD performance as compared to a traditional homojunction device. In particular, the IC device 300 (see line 402) may closely track the ideal performance curve 404 and not deviate substantially even at higher voltage values. This is a result of the improved breakdown performance from the inclusion of the collector second layer 310. From chart 400 it can be seen that including the collector second layer 310 may provide a wide operating voltage range (no significant deviation from ideal voltage curve 404 at elevated voltage levels) of the device and improve IMD performance (closer tracking of line 402 with ideal performance curve 404).

Figure 3:
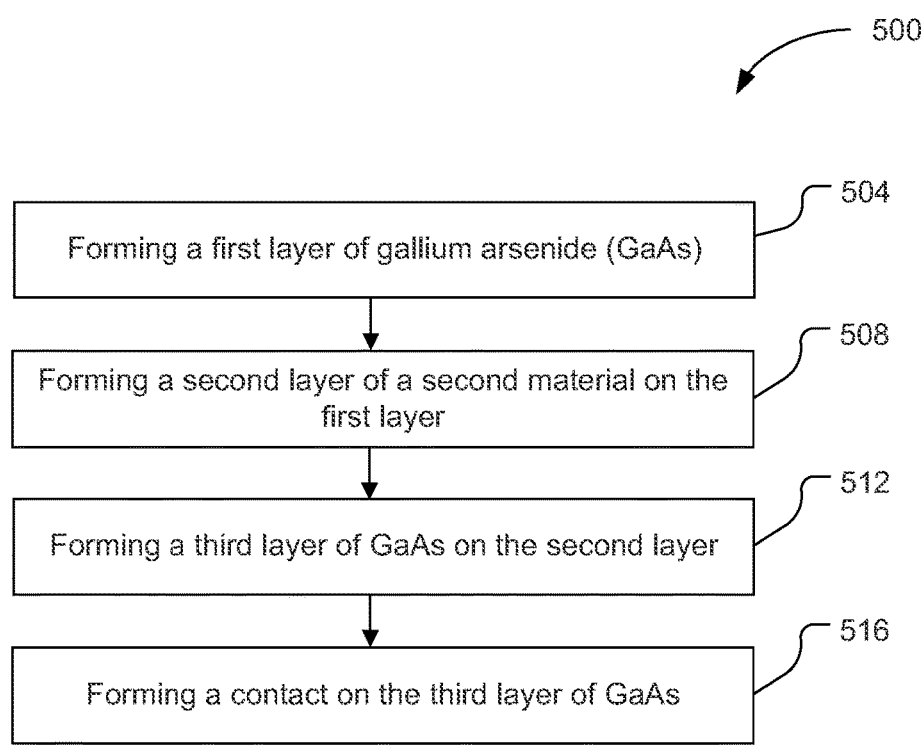
FIG. 3 is a flow diagram of a method for fabricating a varactor diode according to various embodiments.

FIG. 3 shows a flow diagram of a method 500 for fabricating an IC device such as IC device 300, according to various embodiments.

The method 500 begins at 504 with the formation of a first layer of GaAs. This may include forming layer 308 of FIG. 1. The layer may be formed by epitaxial growth or other suitable techniques. Forming the first layer of GaAs may include creating a hyperabrupt doping profile within the first layer. The doping level may increase from a minimum value as the collector/subcollector interface to a maximum level at the interface between the collector first layer and the collector second layer.

The method 500 may continue at 508 with the formation of a second layer of a second material on the first layer. This may include forming the collector second layer 310 of FIG. 1. The layer may be formed by epitaxial growth or other suitable techniques. This layer may be formed of a material having a wider band gap than the material (e.g. GaAs) that makes us the first layer. As discussed previously, the presence of the wider band gap layer at the collector/base interface may increase the breakdown voltage while facilitating the use of increased doping levels in the collector first layer. In some embodiments this layer may be formed from InGaP or AlGaAs. The thickness of the second layer may be substantially less than the thickness of the first layer as discussed with respect to various embodiments above. The second layer may have a thickness that is approximately equal to, or less than, the thickness of the depletion region in the collector at 0 bias. The material for the second layer may be selected such that the second layer is lattice matched to the first layer. As discussed above, the second layer may include more than one layer and may include layers of different materials, such as InGaP or AlGaAs.

The method 500 may further include, at 512, the formation of a third layer of GaAs on the second layer. This may include forming the base layer 312 of FIG. 1. The third layer may be formed by epitaxial growth or other suitable techniques.

The method 500 may also include, at 516, the formation of a contact on the third layer of GaAs. This may include forming the base contact 322 of FIG. 1. This may include performing a metallization process to form the contact. In some embodiments, this may include forming one or more layers of metal by sputtering or other suitable techniques.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 4:
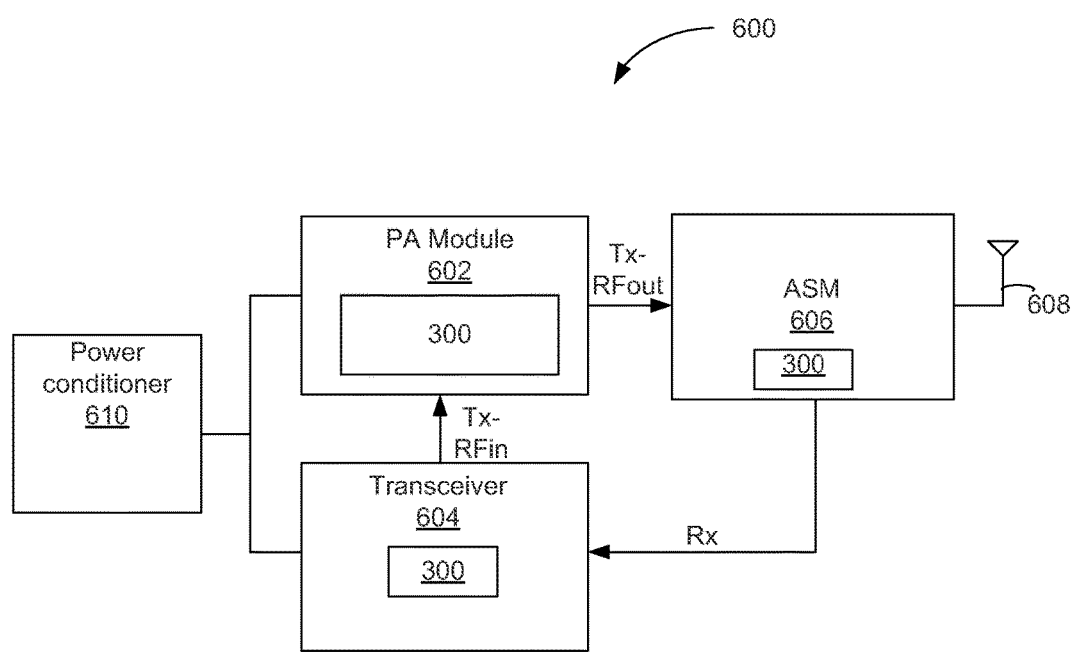
FIG. 4 schematically illustrates an example system including an IC device according to various embodiments.

An IC device, for example, the IC device 300, may be incorporated into various apparatuses and systems. Although shown as 300 throughout FIG. 4 any IC device consistent with the techniques described herein, may be substituted for IC device 300. A block diagram of an example system 600 is illustrated in FIG. 4. As illustrated, the system 600 includes a power amplifier (PA) module 602, which may be a Radio Frequency (RF) PA module in some embodiments. The system 600 may include a transceiver 604 coupled with the power amplifier module 602 as illustrated. The power amplifier module 602 may include an IC device, for example, the IC device 300 described herein.

The power amplifier module 602 may receive an RF input signal, RFin, from the transceiver 604. The power amplifier module 602 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 4.

The amplified RF output signal, RFout, may be provided to an antenna switch module (ASM) 606, which effectuates an over-the-air (OTA) transmission of the RF output signal, RFout, via an antenna structure 608. The ASM 606 may also receive RF signals via the antenna structure 608 and couple the received RF signals, Rx, to the transceiver 604 along a receive chain. In some embodiments, the transceiver 604 may additionally/alternatively include the IC device 300 in, for example, an impedance tuning circuit. In some embodiments, the ASM 606 may additionally/alternatively include the IC device 300 in, for example, an antenna tuning circuit.

In various embodiments, the antenna structure 608 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

In some embodiments, the system 600 may include a power conditioner 610. The power conditioner 610 may be coupled with, and provide power to, various components of the system 600 such as, but not limited to, PA module 602 and transceiver 604.

In various embodiments, the system 600 may be particularly useful for impedance or antenna tuning at high power radio frequency. For example, the system 600 may be suitable for any one or more of terrestrial and satellite communications, radar systems, and possibly in various industrial and medical applications. More specifically, in various embodiments, the system 600 may be a selected one of a radar device, a satellite communication device, a mobile handset, a cellular telephone base station, a broadcast radio, or a television amplifier system.

Figure 5:
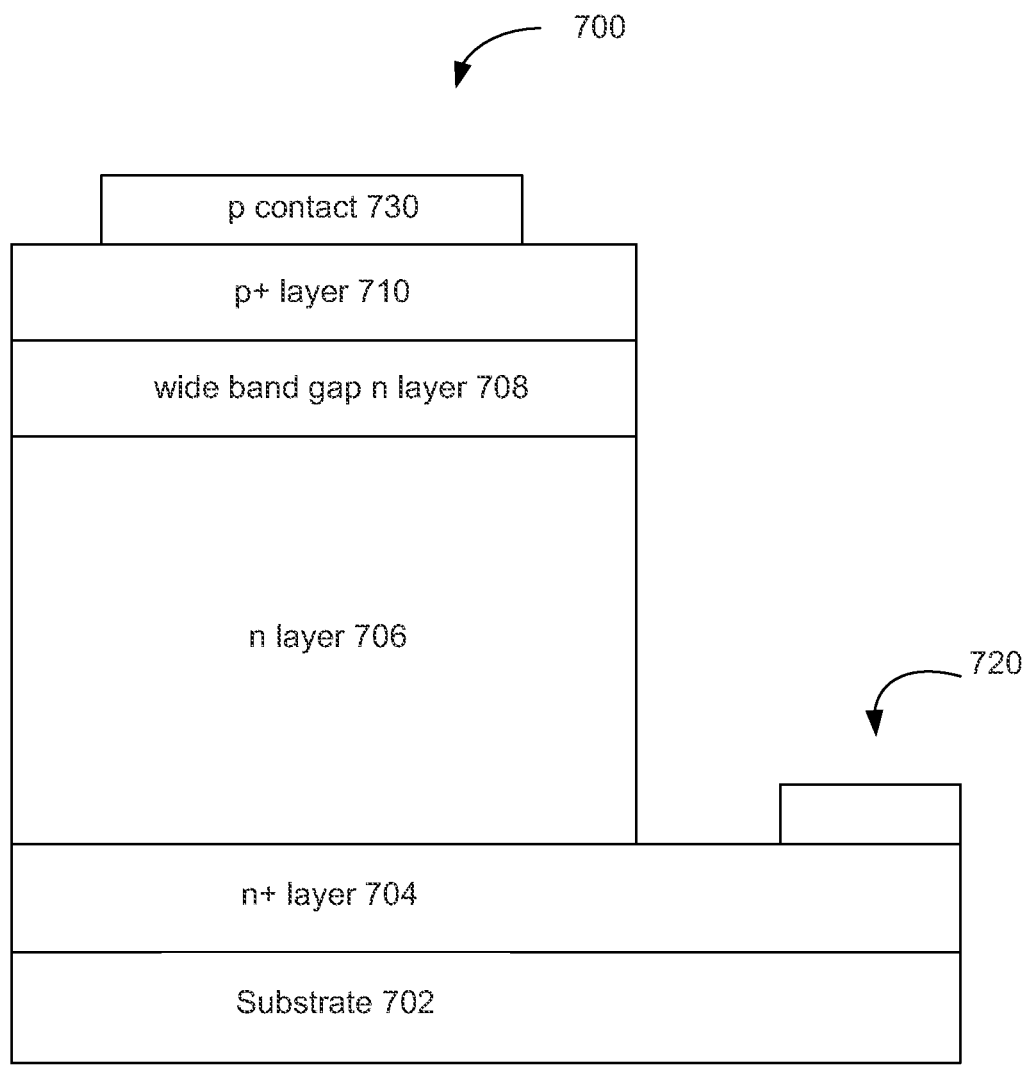
FIG. 5 schematically illustrates a varactor diode including a pn heterojunction according to some embodiments.

FIG. 5 shows a varactor diode including a pn heterojunction according to some embodiments. The previous figures and discussion have used the terms collector and base associated with transistors because varactor diodes may be formed as transistors. In some embodiments, though, varactor diodes may be formed as p-n diodes without necessarily being classified as transistors. FIG. 5 shows a varactor diode 700 formed as p-n diode. The varactor diode 700 may include a substrate 702. The substrate may be GaAs, Silicon, or other suitable materials. The varactor diode 700 may further include an n+ layer 704. An n-contact 720 may be formed on the n+ layer 704. The varactor diode 700 may further include an n layer 706. N layer 706 may have various doping profiles and may include a hyperabrupt doping profile as discussed previously. The doping profile of n layer 706 may impact the tuning range and IMD performance of the varactor diode 700.

A wide band gap n layer 708 may be formed on the n layer 706. The wide band gap n layer 708 may have a wider band gap than the material of the n layer 706. As discussed previously with regard other embodiments, the presence of the wide band gap n layer 708 may increase the breakdown voltage of the device and allow more aggressive doping profiles within the n layer 706. In some embodiments, the wide band gap n layer 708 may be approximately equal to or less than the thickness of the depletion region in the n layers at 0 bias. In some embodiments, the wide band gap n layer 708 may have a thickness between approximately 300 angstroms to 1500 angstroms. In some embodiments the wide band gap n layer 708 may have a thickness between approximately 300 angstroms to 1000 angstroms. In some embodiments the wide band gap n layer 708 may be lattice matched to the n layer 704. The wide band gap n layer 708 may be analogous to the collector second layer 310 discussed above with reference to FIG. 1.

The varactor diode 700 may further include a p+ layer 710 disposed on the wide band gap n layer 708. The p-n junction may be formed at the interface between these two layers. Finally, the varactor diode 700 may include a p contact 730 formed on the p+ layer 710.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A semiconductor device comprising:
a collector including:
a first layer of a first material; and
a second layer formed on the first layer and comprising a first sub-layer of a first type of a second material and a second sub-layer of a second type of the second material; and
a base including a third layer formed on the second layer, wherein a band gap of the second material is greater than a band gap of the first material.

2. The device of claim 1, wherein the first type of the second material is aluminum gallium arsenide (AlGaAs) and the second type of the second material is indium gallium phosphide (InGaP).

3. The device of claim 1, wherein the first type of the second material is indium gallium phosphide (InGaP) and the second type of the second material is aluminum gallium arsenide (AlGaAs).

4. The device of claim 1, wherein the thickness of the second layer is approximately equal to a thickness of a depletion region in the collector at 0 bias.

5. The device of claim 1, wherein the thickness of the second layer is less than a thickness of a depletion region in the collector at 0 bias.

6. The device of claim 1, wherein the thickness of the second layer is between approximately 300 to 1500 angstroms.

7. The device of claim 6, wherein the thickness of the second layer is between approximately 300 to 1000 angstroms.

8. The device of claim 1, wherein the first material is gallium arsenide (GaAs).

9. The device of claim 8, wherein the third layer is composed of GaAs.

10. The device of claim 1, wherein the first layer and the second layer are lattice matched to one another.

11. The device of claim 1, wherein the first layer is doped such that a doping level increases in a direction toward an interface between the first layer and the second layer.

12. The device of claim 1, wherein a thickness of the first layer is at least four times greater than the thickness of the second layer.

13. A method of forming a semiconductor device comprising:
forming a first layer of gallium arsenide (GaAs);
forming a second layer comprising a first sub-layer of a first type of a second material and a second sub-layer of a second type of the second material on the first layer; and
forming a third layer of GaAs on the second layer,
wherein:
the second material is one or more of indium gallium phosphide (InGaP) or aluminum gallium arsenide (AlGaAs);
a thickness of the first layer is at least four times greater than a thickness of the second layer;
the first and second layers are layers of a collector; and
the third layer is a base layer.

14. The method of claim 13, wherein the thickness of the second layer is less than or equal to a thickness of a depletion region in a collector of the semiconductor device at 0 bias.

15. The method of claim 13, wherein forming the first layer further includes doping the first layer such that a doping level increases in a direction towards an interface between the first layer and the second layer.

16. The method of claim 13, wherein forming the first layer further includes doping the first layer such that a doping level increases by at least one order of magnitude over the thickness of the first layer to a maximum value at an interface between the first and second layers.

17. The method of claim 13, wherein the thickness of the second layer is between approximately 300 to 1500 angstroms.

18. The method of claim 13, further comprising forming a contact on the third layer of GaAs.

19. A system comprising:
a transceiver to transmit and receive radio frequency (RF) signals; and
a varactor incorporated within or coupled with the transceiver, the varactor including:
a collector including:
a first layer of a first material; and
a second layer formed on the first layer and comprising a first sub-layer of a first type of a second material and a second sub-layer of a second type of the second material; and
a base including a third layer formed on the second layer, wherein a band gap of the second material is greater than a band gap of first material.

20. The system of claim 19, wherein the varactor is part of an impedance tuning circuit or an antenna tuning circuit.

* * * * *